(12) United States Patent
Baumgartner et al.

(10) Patent No.: US 7,398,488 B2
(45) Date of Patent: Jul. 8, 2008

(54) TRACE EQUIVALENCE IDENTIFICATION THROUGH STRUCTURAL ISOMORPHISM DETECTION WITH ON THE FLY LOGIC WRITING

(75) Inventors: Jason R. Baumgartner, Austin, TX (US); Robert L. Kanzelman, Rochester, MN (US); Hari Mony, Austin, TX (US); Viresh Paruthi, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 70 days.

(21) Appl. No.: 11/383,770

(22) Filed: May 17, 2006

(65) Prior Publication Data

US 2007/0271534 A1  Nov. 22, 2007

(51) Int. Cl.
*G06F 17/50* (2006.01)
(52) U.S. Cl. .............................. 716/3; 716/18; 703/14
(58) Field of Classification Search .............. 716/2–5, 716/7, 10, 18; 703/14
See application file for complete search history.

(56) References Cited

U.S. PATENT DOCUMENTS

| | | | | |
|---|---|---|---|---|
| 6,023,566 A | * | 2/2000 | Belkhale et al. ............... | 716/2 |
| 6,026,222 A | * | 2/2000 | Gupta et al. ................... | 716/5 |
| 6,301,687 B1 | * | 10/2001 | Jain et al. ...................... | 716/3 |
| 6,473,885 B1 | * | 10/2002 | Wallace ........................ | 716/4 |
| 7,032,192 B2 | * | 4/2006 | Prasad et al. .................. | 716/3 |
| 2002/0010899 A1 | * | 1/2002 | Wallace ........................ | 716/2 |
| 2002/0157063 A1 | * | 10/2002 | Besson .......................... | 716/1 |
| 2005/0010888 A1 | * | 1/2005 | Smith et al. ................... | 716/10 |
| 2005/0125757 A1 | * | 6/2005 | Krishnamurthy ............... | 716/7 |

OTHER PUBLICATIONS

"Boolean matching of sequential elements", by Shankar Krishnamoorthy and Frederic Mailhot, Synopsys Inc., ACM/IEEE@ 1994.*

"Sequential Equivalence Checking based on Structura; Similarities", C. A. J. van Eijk, IEEE @2000.*

* cited by examiner

*Primary Examiner*—Paul Dinh
*Assistant Examiner*—Nha T Nguyen
(74) *Attorney, Agent, or Firm*—Cantor Colburn LLP; Cas Salys

(57) ABSTRACT

A method for performing trace equivalent identification by structural isomorphism detection, the method comprising: synthesizing a first netlist into a second netlist, the second netlist including two-input AND gates, inversions, inputs, constants, and registers; constructing a third netlist, the third netlist being a pseudo-canonical netlist that uses calls to algorithms for constructing a netlist for gate g1 and for constructing a netlist for gate g2, where g1 and g2 are gates; and performing an isomorphism check of gates g1 and g2.

5 Claims, 4 Drawing Sheets

---

1. Synthesize original netlist N1 into netlist N2 containing only 2-input AND gates, inversions, inputs, constants, and registers.

2. construct a pseudo-canonical netlist N3 from N2 using calls to algorithms construct_netlist(gate g1) and construct_netlist(gate g2), where g1 and g2 are the gates being isomorphism-checked.

3. Perform the isomorphism check of g1 and g2 on netlist N3.

FIGURE 1 bool is_isomorphic(gate g1, gate g2)

1.    if (GATE_THYPE(g1)!=GATE_TYPE(g2)){return FALSE;}

2.    if ((GATE_TYPE(g1)!=INPUT) && (IS_INVERTED(g1)!=IS_INVERTED(g2))){return FALSE;}

3.    if (#SOURCING_GATES(g1)!=#SOURCING_GATES(g2)){return FALSE;}

4.    if ((visited(g1) || visited(g2)) && (visited(g1)!=g2)){return FALSE;}

5.    visited(g1)=g2;

6.    visited(g2)=g1;

7.    try to map the source gates of g1 with any consistent permutation of source gates g2 using is_isomorphic calls;

8.    if we find a permutation, return TRUE;

9.    else reset all "visited" pairings attempted under this g1-g2 pairing (i.e., during recursive calls to is_isomorphic in Step 7); return FALSE;

PRIOR ART

FIGURE 2

1. Synthesize original netlist N1 into netlist N2 containing only 2-input AND gates, inversions, inputs, constants, and registers.

2. construct a pseudo-canonical netlist N3 from N2 using calls to algorithms construct_netlist(gate g1) and construct_netlist(gate g2), where g1 and g2 are the gates being isomorphism-checked.

3. Perform the isomorphism check of g1 and g2 on netlist N3.

FIGURE 3

Void construct_netlist(gate g)

1. if done(g) return
2. identify the most concise type t1 of gate which may be used to represent the local function of g
3. collect as many "inputs" as possible which may be connected to the inputs of a gate of type t1 to represent the local function of g. These "inputs" are generally gates appearing in the fan-in cone of g
4. prune the set of inputs collected in step 3 using semantics-preserving rules for type t1
5. if necessary, update the type of t1 given the pruned set of inputs
6. create a new gate g1 of type t1, and connect the pruned set of inputs to g1
7. replace g with g1
8. done(g) = TRUE
9. call construct_netlist(gi)on each of the pruned input gates from step 4

FIGURE 4 bool is_isomorphic(gage g1, gate g2){

| | |
|---|---|
| 1. | if (GATE_TYPE(g1)!=GATE_TYPE(g2)){return FALSE;} |
| 2. | if (#SOURCING_GATES(g1)!=#SOURCING_GATES(g2)){return FALSE;} |
| 3. | if ((visited(g1) \|\| visited(g2)) && (visited(g1)!=g2)){return FALSE;} |
| 4. | if (IS_INVERTED(g1)!=IS_INVERTED(g2)){inverted=1;} |
| 5. | if(inverted){ |
| 6. | if(cannot_be_inversion_remapped(GATE_TYPE(g1))){return FALSE;} |
| 7. | obtain mapping requirements R1 given GATE_TYPE(g1); |
| 8. | } |
| 9. | visited(g1) = g2; |
| 10. | visited(g2) = g1; |
| 11. | try to map the source gates of g1 with any consistent permutation adhering to R1 of source gates g2 using is_isomorphic calls; |
| 12. | if we find a permutation, return TRUE; |
| 13. | else reset all "visited" pairings attempted under this g1-g2 pairing (i.e., during recursive calls to is_isomorphic in Step 11); return FALSE; |

# TRACE EQUIVALENCE IDENTIFICATION THROUGH STRUCTURAL ISOMORPHISM DETECTION WITH ON THE FLY LOGIC WRITING

TRADEMARKS

IBM® is a registered trademark of International Business Machines Corporation, Armonk, N.Y., U.S.A. Other names used herein may be registered trademarks, trademarks or product names of International Business Machines Corporation or other companies.

BACKGROUND OF THE INVENTION

1. Field of the Invention

This invention relates to structural isomorphism detection, and particularly to structural isomorphism detection involving static rewriting to provide enhanced trace equivalence identification.

2. Description of Background

Structural isomorphism refers to the existence of a 1:1 topological mapping between equal-functioned gates of a netlist. Structural isomorphism detection has numerous applications. For example, if two or more properties under verification are determined to have isomorphic logic cones driving them, one may merely verify one of the properties, and map the corresponding verification results to the other property. As another example, one may exploit the existence of structural isomorphism between gates of a netlist to infer optimal Binary Decision Diagram (BDD) orders.

The primary goal of structural isomorphism detection is to quickly identify trace-equivalent gates, i.e., gates g1 and g2, such that for any legal trace (sequence of valuations over time) over g1, there exists a legal trace with an identical sequence of valuations for g2 and vice-versa. Exact methods for identifying trace equivalence via semantic analysis require exponential resources. Structural isomorphism often requires substantially lesser resources. Unfortunately, structural isomorphism is a weak approach for identifying trace equivalence. In other words, two gates g1 and g2 may be trace equivalent, but may not have isomorphic logic cones. Thus, structural isomorphism detection fails to identify that trace equivalence.

It is well known that logic rewriting algorithms may put a netlist into a more canonical form, i.e., such that it is more likely that two gates with equivalent functions attain equivalent structures. However, existing rewriting algorithms are lossy, and thus fail to render all trace equivalent gates as having isomorphic structures. It is desired to provide a set of improved algorithms for allowing structural isomorphism detection to identify trace equivalent gates.

SUMMARY OF THE INVENTION

The shortcomings of the prior art are overcome and additional advantages are provided through the provision of a method for performing trace equivalence identification by structural isomorphism detection, the method comprising: synthesizing a first netlist into a second netlist, the second netlist including two-input AND gates, inversions, inputs, constants, and registers; constructing a third netlist, the third netlist being a pseudo-canonical netlist that uses calls to algorithms (i) construct_netlist (gate g1) and (ii) construct_netlist (gate g2), where g1 and g2 are gates; and performing an isomorphism check of gates g1 and g2.

The shortcomings of the prior art are overcome and additional advantages are provided through the provision of a method for performing trace equivalence identification by structural isomorphism detection, the method comprising: synthesizing a first netlist into a second netlist, the second netlist including two-input AND gates, inversions, inputs, constants, and registers; constructing a third netlist, the third netlist being a pseudo-canonical netlist that uses calls to algorithms (i) construct_netlist (gate g1) and (ii) construct_netlist (gate g2), where g1 and g2 are gates; performing an isomorphism check of gates g1 and g2; determining whether gates g1 and g2 are inverted; and mapping gates g1 and g2 to non-inverted gates g1 and g2, if gates g1 and g2 are determined to be inverted.

Additional features and advantages are realized through the techniques of the present invention. Other embodiments and aspects of the invention are described in detail herein and are considered a part of the claimed invention. For a better understanding of the invention with advantages and features, refer to the description and to the drawings.

TECHNICAL EFFECTS

As a result of the summarized invention, technically we have achieved a solution which performs trace equivalent identification by structural isomorphism detection.

BRIEF DESCRIPTION OF THE DRAWINGS

The subject matter, which is regarded as the invention, is particularly pointed out and distinctly claimed in the claims at the conclusion of the specification. The foregoing and other objects, features, and advantages of the invention are apparent from the following detailed description taken in conjunction with the accompanying drawings in which:

FIG. 1 illustrates one example of a traditional algorithm for isomorphism detection;

FIG. 2 illustrates one example of an algorithm for isomorphism detection on a pseudo-canonical netlist;

FIG. 3 illustrates one example of an algorithm for generating a pseudo-canonical netlist; and FIG. 4 illustrates one example of a modified algorithm for isomorphism detection with on the fly rewriting.

The detailed description explains the preferred embodiments of the invention, together with advantages and features, by way of example with reference to the drawings.

DETAILED DESCRIPTION OF THE INVENTION

One aspect of the exemplary embodiments is a static rewriting approach, which puts the netlist graph in a more canonical form, improving upon the conclusiveness of prior approaches. Another aspect of the exemplary embodiments is a mechanism for emulating rewriting steps on the fly during structural isomorphism detection, improving upon the lossiness of static rewriting approaches Turning now to the drawings in greater detail, FIG. 1 illustrates a traditional algorithm for isomorphism detection.

Specifically, a netlist contains a directed graph with vertices representing gates, and edges representing interconnections between those gates. The gates have associated functions, such as constants, primary inputs, combinational logic, such as AND gates, and sequential elements (e.g., registers). Registers have two associated components: their next-state functions, and their initial-value functions. Both are represented as other gates in the graph. Semantically, for a given register, the value appearing at its initial-value gate at time "0" ("initialization" or "reset" time) is applied as the value of the register itself; the value appearing at its next-state function gate at time "i" is applied to the register itself at time "I+1." It is assumed that the inverters are implicit attributes with references to gates. For instance, a gate reference includes not only the identified gate itself, but also whether that identified gate is referenced as inverted.

Two gates h1 and h2 are said to be trace-equivalent if for every trace t1 illustrating a sequence of values to h1, there exists another trace t2, which illustrates the identical sequence of values to h2 and vice-versa.

Step 7 of FIG. 1 attempts to identify isomorphic pairings among all consistent permutations of inputs of gates g1 and g2. This is, for example, to prevent an AND gate (h1 & h2) from appearing non-isomorphic to another AND gate (h2 & h1), whereas those two AND gates are functionally identical and hence trace-equivalent. However, certain gates, such as registers, cannot have their inputs permuted.

Therefore, if a register is assumed to be represented as a 2-input gate, then register r1 has an initial value function which is gate h1 and whose next-state function is h2; and register r2 has an initial value function which is gate h2 and whose next-state function is h1. r1 and r2 are not necessarily trace-equivalent; hence the isomorphism detection algorithm cannot permute the inputs of registers as this would render inconsistent results.

Referring to FIG. 2, a static structural rewriting approach that puts the netlist in a more canonical form, thereby enhancing the ability of structural isomorphism detection algorithms to identify trace-equivalent gates, is illustrated according to an exemplary embodiment of this application.

While traditional algorithms such as that of FIG. 1 account for the ability to permute the inputs of symmetric gate types (such as AND gates), they do not generally account for the fact that there are numerous ways to implement a given function with a netlist. For example, the function g1 XOR g2 may be implemented as such by using a single XOR gate; may be implemented as NOT (g1==g2); may be implemented as (g1 AND (NOT g2)) OR (NOT g1) AND g2); or may be implemented as NOT ((g1 AND g2) OR ((NOTg1) AND (NOT g2))).

Traditional logical rewriting algorithms partially address this problem by attempting to eliminate functional redundancy within a netlist (i.e., to merge multiple gates which always evaluate to the same value), and render a more compact form of a netlist (e.g., by rewriting ((g1 AND g2) AND (g1 AND g3)) as ((g1 AND g2) AND g3)). However, such approaches are not adequate to ensure that two gates with equivalent functions to attain equivalent structures.

The exemplary embodiments of the present application address this problem by deriving a pseudo-canonical netlist representation comprising maximally concise gate types, with a maximal number of inputs per gate. The basic algorithm for performing isomorphism detection is depicted in FIG. 2.

The algorithm in FIG. 2 for creating the pseudo-canonical netlist is construct_netlist(gate g), and is depicted in FIG. 3. Referring to FIG. 3, the algorithm uses a "done" flag to avoid infinite recursions on cyclic sequential netlists. In Step 2, the algorithm attempts to identify the most concise, or high-level, type of gate, which may be used to represent the local function of gate g. This can be done via structural or semantic analysis. It is an implementation-specific detail how many gate types are to be supported. AND, REGISTER, INPUT, INVERTER, and CONSTANT-ZERO are often used to represent a sequential netlist. Additionally supporting XOR gates is beneficial. Other types of gates, such as ADDER and MULTIPLEXOR, are also beneficial.

For example, if gate g is of the form (h1 OR h2) where h1 is of the form (g1 AND (NOT g2)) and h2 is of the form ((NOT g1) AND g2)), t1 may be chosen as an OR gate—as it is in the original netlist—or it may be recognized that this logic implements function (g1 XOR g2) and select t1 as an XOR gate. The latter is more concise, in that a single XOR gate may represent the logic that otherwise would require one OR and two AND gates. Thus, a typical implementation would select t1 as XOR.

In Step 3, the algorithm collects the set of input gates, which may be connected to the chosen gate type of g1 while implementing the same function as the logic local to g. For example, if gate g is of the form (h1 OR h2) where h1 is of the form (g1 AND (NOT g2)) and h2 is of the form ((NOT g1) AND g2)), the input gates are g1 and g2. If g1 is of the form (g3 XOR g4), the input gates are be g2, g3, and g4. In practice this step may be combined with Step 2 when analyzing the function of the logic to be replaced.

Step 4 seeks to reduce the number of input gates using logic-rewriting rules. For example, it is well known that (A XOR A XOR B) is equivalent to B, thus if two identical gates appear in this set and t1 is XOR, it is possible to eliminate those pairs from the list. Similarly, (A AND A AND B) is equivalent to (A AND B), thus if t1 is AND, it is possible to eliminate all redundant pairs from the list. Each type of gate has its own pruning rules, which are well known logic rules.

Step 5 may enable a greater degree of canonicization. For example, if t1 is of the type AND, and the input gates before reducing or pruning are of the form (A AND (NOT A)), it is possible to eliminate A and NOT A as input gates and replace them by a single input gate CONSTANT-ZERO. But rather than creating g1 as a 1-input AND gate with input CONSTANT-ZERO, it is preferable to instead change t1 to CONSTANT-ZERO itself. Without this step, unnecessary mismatches may be produced due to different gate types representing 1-input functions.

Overall, this algorithm yields a more canonical netlist representation, enabling structural isomorphism detection to identify trace-equivalent gates despite a more diverse initial netlist representation.

Another feature of embodiments of the invention is a mechanism for emulating rewriting steps on-the-fly during structural isomorphism detection. This offers greater trace-equivalence detection than is possible through mere static rewriting as described above. Referring to FIG. 4, during structural isomorphism detection, one may allow the isomorphism mapping of the non-inverted INPUT gate to an inverted one. This is reflected by the special consideration given to INPUT gates in step 2 of the algorithm of FIG. 1. This is because INPUT gates may freely take any values when verifying a design, thus, an inverted INPUT is trace-equivalent to a non-inverted one. However, one cannot generally allow the mapping of an inverted gate of another type (such as an AND gate) to a non-inverted one, as that could yield false matches for non-trace-equivalent gates.

Nevertheless, there are specific cases in which mapping of non-inverted gates to inverted gates is allowable. For example, it is well known that (A XOR B) is equivalent to NOT (A XOR (NOT B)). For this reason, one may map an XOR gate to an inverted XOR gate, as long as while isomorphism mapping the inputs to that XOR gate, exactly one of the input mappings is inverted.

As another example, one may map a REGISTER to an inverted REGISTER, as long as while isomorphism mapping is initial-value and next-state functions, both of these functions were mapped as inverted.

The algorithm of FIG. 4 is a modified version of that of FIG. 1, talking into account the ability to map non-INPUT gates to inverted gates in specific cases. In Step 4, it is identified whether the algorithm is asked to map an inverted to a non-inverted gate. If so, in Steps 5-8, it is checked whether the gate type allows such a mapping.

For example, as discussed above, XOR and REGISTER types allow such mapping. If the implementation allows other gate types, those in cases may be supported; e.g., a MULTIPLXOR may be mapped to an inverted MULTIPLEXOR by inverting the data inputs (but not the selector input) during the mapping. However, AND gates cannot be mapped to inverted AND gates, so function cannot_be_inversion_remapped (AND) would return true causing a mismatch result.

If the mapping is allowed, the requirements R1 for the recursive is_isomorphic call are collected in Step 11. As stated above, if GATE_TYPE(g1) is XOR, R1 would indicate that exactly one of the inputs to gate g1 must be mapped inverted. If GATE_TYPE(g1) is REGISTER, R1 would indicate that all inputs must be mapped inverted. If GATE_TYPE (g1) is MULTIPLEXOR, R1 would indicate that all data inputs (but not the selector input) must be mapped inverted.

The capabilities of the present invention can be implemented in software, firmware, hardware or some combination thereof.

As one example, one or more aspects of the present invention can be included in an article of manufacture (e.g., one or more computer program products) having, for instance, computer usable media. The media has embodied therein, for instance, computer readable program code means for providing and facilitating the capabilities of the present invention. The article of manufacture can be included as a part of a computer system or sold separately.

Additionally, at least one program storage device readable by a machine, tangibly embodying at least one program of instructions executable by the machine to perform the capabilities of the present invention can be provided.

The flow diagrams depicted herein are just examples. There may be many variations to these diagrams or the steps (or operations) described therein without departing from the spirit of the invention. For instance, the steps may be performed in a differing order, or steps may be added, deleted or modified. All of these variations are considered a part of the claimed invention.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A method for performing trace equivalent identification by structural isomorphism detection, the method comprising:
   synthesizing a first netlist into a second netlist, the second netlist including two-input AND gates, inversions, inputs, constants, and registers;
   constructing a third netlist from the second netlist, the third netlist being a pseudo-canonical netlist that uses calls to algorithms for constructing a netlist for gate g1 and for constructing a netlist for gate g2, where g1 and g2 are gates in the second netlist; and
   performing an isomorphism check of gates g1 and g2, the isomorphism check mapping gate g1 to an inverted gate g1 and inverting a mapped input to inverted gate g1, the isomorphism check mapping gate g2 to an inverted gate g2 and inverting a mapped input to inverted gate g2;
   wherein an algorithm for constructing the third netlist for gate g1 includes:
   identifying a high-level type gate, the high-level type gate being used to represent a local function of g1;
   collecting input gates to be connected to inputs of the high-level type gate used to represent the local function of g1;
   reducing the input gates collected in the collecting step by using semantics-preserving rules;
   updating the high-level type gate to alter the type of the high-level type gate to an updated type;
   creating a second gate having the updated type;
   connecting the reduced inputs gates collected in the collecting step to the second gate; and
   replacing the high-level type gate with the second gate.

2. The method of claim 1, wherein an algorithm for creating the third netlist recursively processes the fan-in cone of a gate g.

3. The method of claim 2, wherein the algorithm uses a flag to avoid infinite recursions on cyclic sequential netlists.

4. The method of claim 1, wherein gates g1 and g2 are XOR gates or REGISTER gates.

5. The method of claim 1, wherein gates g1 and g2 are MULTIPLEXOR gates.

* * * * *